US012795947B2

(12) United States Patent
Sung et al.

(10) Patent No.: US 12,795,947 B2
(45) Date of Patent: Nov. 10, 2026

(54) CHALCOGENIDE MATERIAL, DEVICE AND MEMORY DEVICE INCLUDING THE SAME

(71) Applicant: Samsung Electronics Co., Ltd., Suwon-si (KR)

(72) Inventors: Hajun Sung, Hwaseong-si (KR); Bonwon Koo, Suwon-si (KR); Segab Kwon, Seoul (KR); Yongyoung Park, Hwaseong-si (KR); Dongho Ahn, Hwaseong-si (KR); Kiyeon Yang, Seoul (KR); Wooyoung Yang, Suwon-si (KR); Changseung Lee, Yongin-si (KR); Minwoo Choi, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 1157 days.

(21) Appl. No.: 17/523,363

(22) Filed: Nov. 10, 2021

(65) Prior Publication Data

US 2022/0406842 A1 Dec. 22, 2022

(30) Foreign Application Priority Data

Jun. 22, 2021 (KR) ........................ 10-2021-0081035

(51) Int. Cl.

*H10B 63/00* (2023.01)
*C01B 19/00* (2006.01)
*H10B 61/00* (2023.01)

(52) U.S. Cl.

CPC ........... *H10B 63/24* (2023.02); *C01B 19/007* (2013.01); *H10B 61/10* (2023.02); *C01P 2002/50* (2013.01); *C01P 2006/40* (2013.01)

(58) Field of Classification Search

CPC ........ H10B 63/24; H10B 63/10; H10B 63/22; H10B 61/10; C01B 19/007; C01B 19/002;

(Continued)

(56) References Cited

U.S. PATENT DOCUMENTS 3,877,049 A * 4/1975 Buckley ............... H10N 70/841 365/96
5,330,630 A * 7/1994 Klersy ................. H10N 70/826 204/192.15

(Continued)

FOREIGN PATENT DOCUMENTS

CN 106784309 A 5/2017
CN 109103330 A 12/2018

(Continued)

OTHER PUBLICATIONS

Liu, et al, Iodine-doped Ga—As—Se glasses with high purity and low dispersion, Spectrochimica Acta Part A: Molecular and Biomolecular Spectroscopy, vol. 229, 2020, 117885, https://doi.org/10.1016/j.saa.2019.117885. (Year: 2020).*

(Continued)

*Primary Examiner* — William B Partridge
*Assistant Examiner* — Linda J. Fleck
(74) *Attorney, Agent, or Firm* — Harness, Dickey & Pierce, P.L.C.

(57) ABSTRACT

Provided are a chalcogenide material, and a device and a memory device each including the same. The chalcogenide material may include: germanium (Ge) as a first component; arsenic (As) as a second component; at least one element selected from selenium (Se) and tellurium (Te) as a third component; and at least one element selected from the elements of Groups 2, 16, and 17 of the periodic table as a fourth component, wherein a content of the first component (Continued)

may be from 5 at % to 30 at %, a content of the second component may be from 20 at % to 40 at %, a content of the third component may be from 25 at % to 75 at %, and a content of the fourth component may be from 0.5 at % to 5 at %.

34 Claims, 10 Drawing Sheets

(58) Field of Classification Search
CPC ............. C01P 2002/50; C01P 2006/40; H10N 70/826; H10N 70/8825; H10N 70/8828
See application file for complete search history.

(56) References Cited

U.S. PATENT DOCUMENTS

| | | | | |
|---|---|---|---|---|
| 7,518,904 | B2 * | 4/2009 | Dodge | G11C 13/0069 365/163 |
| 7,638,789 | B2 | 12/2009 | Peters | |
| 7,864,567 | B2 | 1/2011 | Gordon et al. | |
| 8,598,560 | B1 * | 12/2013 | Milojevic | G11C 13/0011 257/3 |
| 9,379,321 | B1 | 6/2016 | Chang et al. | |
| 9,704,921 | B2 | 7/2017 | Kim et al. | |
| 9,748,311 | B2 | 8/2017 | Fantini et al. | |
| 10,062,840 | B2 | 8/2018 | Sim et al. | |
| 10,084,017 | B2 * | 9/2018 | Ohba | G11C 13/0004 |
| 10,163,977 | B1 | 12/2018 | Fantini et al. | |
| 10,186,552 | B2 | 1/2019 | Choi et al. | |
| 10,374,009 | B1 * | 8/2019 | Cheng | H10B 63/24 |
| 10,403,681 | B2 | 9/2019 | Ahn et al. | |
| 10,868,249 | B2 | 12/2020 | Lee et al. | |
| 2007/0247899 | A1 * | 10/2007 | Gordon | H10N 70/826 365/163 |
| 2016/0181320 | A1 | 6/2016 | Kim | |
| 2017/0237000 | A1 | 8/2017 | Terai et al. | |
| 2019/0035851 | A1 * | 1/2019 | Tortorelli | H10B 63/24 |
| 2019/0148456 | A1 | 5/2019 | Wu et al. | |
| 2019/0165264 | A1 * | 5/2019 | Wu | H10B 63/10 |
| 2019/0252609 | A1 | 8/2019 | Sei et al. | |
| 2019/0267502 | A1 * | 8/2019 | Lee | C25D 5/10 |
| 2020/0013951 | A1 * | 1/2020 | Wu | H10B 63/80 |
| 2021/0005664 | A1 * | 1/2021 | Fratin | H10B 63/845 |
| 2021/0083185 | A1 * | 3/2021 | Jung | H10B 61/10 |
| 2022/0123209 | A1 * | 4/2022 | Cheng | H10B 63/84 |
| 2022/0140003 | A1 | 5/2022 | Yang et al. | |
| 2022/0149114 | A1 | 5/2022 | Yang et al. | |
| 2023/0329007 | A1 * | 10/2023 | Sung | H10N 70/8413 257/5 |
| 2025/0040151 | A1 * | 1/2025 | Zhu | H10N 70/882 |
| 2025/0365984 | A1 * | 11/2025 | Wu | H10N 50/01 |

FOREIGN PATENT DOCUMENTS

| | | | | |
|---|---|---|---|---|
| CN | 111326651 | A | | 6/2020 |
| CN | 111463346 | A | | 7/2020 |
| JP | H01234343 | A | * | 9/1989 |
| JP | 2020/013970 | A | | 1/2020 |
| KR | 2017/0099214 | A | | 8/2017 |
| KR | 2018/0109287 | A | | 10/2018 |
| WO | 2019/167538 | A1 | | 9/2019 |

OTHER PUBLICATIONS

M. Doumeng et al., "Etudes Physico-Chimiques d'une Serie de Verres Chalcogenures Te60As25Ge13Mx (M=S ou Se)," Mat. Res. Bull. vol. 8, pp. 635-646, 1973. (Year: 1973).*

J. Lucas et al., "The tellurium halide glasses," Journal of Non-Crystalline Solids 125 (1990) pp. 1-16. (Year: 1990).*

P. Klaska et al., "High Tg' germanium-tellurium-halide glasses" Journal of Non-Crystalline Solids 161 (1993) pp. 291-300. (Year: 1993).*

J.S. Sanghera et al., "Measurement of bulk absorption coefficients of chalcogenide and chalcohalide glasses at 10.6 μm using CO2 laser calorimetry," Journal of Non-Crystalline Solids 161 (1993) pp. 320-322. (Year: 1993).*

J. Xu et al., "The effects of Te, I atoms on the properties and structure of Ge—As—Se system glasses," Journal of Non-Crystalline Solids 184 (1995) pp. 302-308. (Year: 1995).*

A.B Seddon, "Chalcohalides: glass-forming systems and progress in application of percolation theory," Journal of Non-Crystalline Solids vols. 213-214, May 12, 1997, pp. 22-29. (Year: 1997).*

Jeffrey M. Harbold, "Highly Nonlinear Ge—As—Se and Ge—As—S—Se Glasses for All-Optical Switching" *IEEE Photonics Technology Letters*, vol. 14, No. 6, (Jun. 2002), pp. 822-824.

Korean Office Action dated Dec. 2, 2025 for corresponding Korean Patent Application No. 10-2021-0081035 and its English-language translation.

* cited by examiner

CHALCOGENIDE MATERIAL, DEVICE AND MEMORY DEVICE INCLUDING THE SAME

CROSS-REFERENCE TO RELATED APPLICATION

This application is based on and claims priority under 35 U.S.C. § 119 to Korean Patent Application No. 10-2021-0081035, filed on Jun. 22, 2021, in the Korean Intellectual Property Office, the disclosure of which is incorporated by reference herein in its entirety.

BACKGROUND

1. Field

The present disclosure relates to chalcogenide materials and devices and memory devices each including the same.

2. Description of the Related Art

With the development of compact and high-performance electronic devices in recent years, there is a demand for memory devices capable of storing information in various electronic devices such as computers and portable communication devices. Such memory devices may include resistive random-access memory (RRAM), phase-change random access memory (PRAM), and magnetic random-access memory (MRAM) which store data using switching properties between different resistance states in accordance with voltage or current applied thereto. A chalcogenide material may be used in a selector included in such a memory device. The selector may be required to be a selector layer having a small thickness to realize compact, large capacity, and high performance of electronic devices. As the thickness of the selector layer decreases, a threshold voltage $V_{th}$ tends to decrease and a leakage current tends to increase. Therefore, there may be a need to develop a chalcogenide material having a novel composition, and a device and a memory device each including the same.

SUMMARY

Provided are chalcogenide materials including a GeAsSe-based material with ovonic threshold switching properties and having a high threshold voltage $V_{th}$ and/or a low leakage current.

Provided are devices including the chalcogenide materials as selectors.

Provided are memory devices including the chalcogenide materials as selectors.

Additional aspects will be set forth in part in the description which follows and, in part, will be apparent from the description, or may be learned by practice of the presented embodiments of the disclosure.

According to an embodiment, a chalcogenide material may include germanium (Ge) as a first component; arsenic (As) as a second component; at least one element selected from selenium (Se) and tellurium (Te) as a third component, and at least one element selected from periodic table elements of Groups 2, 16, and 17 as a fourth component. A content of the first component may be from 5 at % to 30 at %. A content of the second component may be from 20 at % to 40 at %. A content of the third component may be from 25 at % to 75 at %. A content of the fourth component may be from 0.5 at % to 5 at %.

In some embodiments, the content of the first component may be from 5 at % to 25 at %.

In some embodiments, the content of the second component may be from 20 at % to 35 at %.

In some embodiments, the content of the third component may be from 25 at % to 60 at %.

In some embodiments, the fourth component may include at least one element selected from beryllium (Be), sulfur (S), fluorine (F), chlorine (Cl), iodine (I), and bromine (Br).

According to an embodiment, a device may include a first electrode; a second electrode; and a selector electrically connected between the first electrode and the second electrode. The selector may include a chalcogenide material including germanium (Ge) as a first component; arsenic (As) as a second component; at least one element selected from selenium (Se) and tellurium (Te) as a third component, and at least one element selected from periodic table elements of Groups 2, 16, and 17 as a fourth component. A content of the first component may be from 5 at % to 30 at %. A content of the second component may be from 20 at % to 40 at %. A content of the third component may be from 25 at % to 75 at %. A content of the fourth component may be from 0.5 at % to 5 at %.

In some embodiments, the content of the first component may be from 5 at % to 25 at %.

In some embodiments, the content of the second component may be from 20 at % to 35 at %.

In some embodiments, the content of the third component may be from 25 at % to 60 at %.

In some embodiments, the fourth component may include at least one element selected from beryllium (Be), sulfur (S), fluorine (F), chlorine (Cl), iodine (I), and bromine (Br).

In some embodiments, the chalcogenide material may exhibit ovonic threshold switching properties.

In some embodiments, an energy band gap of the chalcogenide material may be greater than an energy band gap of an other chalcogenide material including the first component, the second component, and the third component without the fourth component.

In some embodiments, a threshold voltage $V_{th}$ of the selector may be higher than a threshold voltage $V_{th}$ of a selector including a chalcogenide material including the first component, the second component, and the third component without the fourth component.

In some embodiments, a leakage current of the selector may be lower than a leakage current of an other selector including an other chalcogenide material. The other chalcogenide material may include the first component, the second component, and the third component without the fourth component.

According to an embodiment, a memory device may include a bit line first electrode; a word line second electrode; and a memory cell electrically connected between the bit line first electrode and the word line second electrode at an intersection where the word line second electrode and the bit line first electrode cross each other. The memory cell may include a memory element and a selector electrically connected to the memory element. The selector may include a chalcogenide material including germanium (Ge) as a first component; arsenic (As) as a second component; at least one element selected from selenium (Se) and tellurium (Te) as a third component; and at least one element selected from periodic table elements of Groups 2, 16, and 17 as a fourth component. A content of the first component may be from 5 at % to 30 at %, a content of the second component may be from 20 at % to 40 at %, a content of the third component may be from 25 at % to 75 at %, and a content of the fourth component may be from 0.5 at % to 5 at %.

In some embodiments, the content of the first component may be from 5 at % to 25 at %.

In some embodiments, the content of the second component may be from 20 at % to 35 at %.

In some embodiments, the content of the third component may be from 25 at % to 60 at %.

In some embodiments, the fourth component may include at least one element selected from beryllium (Be), sulfur (S), fluorine (F), chlorine (Cl), iodine (I), and bromine (Br).

In some embodiments, an energy band gap of the chalcogenide material may be greater than an energy band gap of an other chalcogenide material including the first component, the second component, and the third component without the fourth component.

In some embodiments, a threshold voltage $V_{th}$ of the selector may be higher than a threshold voltage $V_{th}$ of a selector including a chalcogenide material including the first component, the second component, and the third component without the fourth component.

In some embodiments, a leakage current of the selector may be lower than a leakage current of an other selector including an other chalcogenide material. The other chalcogenide material may include the first component, the second component, and the third component without the fourth component.

In some embodiments, the memory device may further include a third electrode between the memory element and the selector.

In some embodiments, the memory cell may include a non-volatile memory element.

In some embodiments, the memory device may include a PRAM, an RRAM, or a MRAM.

According to an embodiment, a chalcogenide material may include germanium (Ge) as a first component; arsenic (As) as a second component; a third component including at least one of selenium (Se) and tellurium (Te), and a fourth component. The fourth component may include at least one of beryllium (Be), sulfur (S), fluorine (F), chlorine (Cl), iodine (I), and bromine (Br). A content of the first component may be from 5 at % to 30 at %. A content of the second component may be from 20 at % to 40 at %. A content of the third component may be from 25 at % to 75 at %. A content of the fourth component may be from 0.5 at % to 5 at %.

In some embodiments, the content of the first component may be from 5 at % to 25 at %.

In some embodiments, the content of the second component may be from 20 at % to 35 at %.

In some embodiments, the content of the third component may be from 25 at % to 60 at %.

In some embodiments, the chalcogenide material may be a $Ge_wAs_xSe_yTe_z$-based material including the fourth component as a dopant, where w may be from 5 at % to 25 at %, x may be from 20 at % to 35 at %, 25 at %≤y+0≤z≤60 at %, 0≤y, and 0≤z, provided that one of y and z is not 0.

In some embodiments, the chalcogenide material may exhibit ovonic threshold switching properties.

In some embodiments, the chalcogenide material may not include silicon (Si).

In some embodiments, the chalcogenide material may not include antimony (Sb).

In an embodiment, a device may include a first electrode; a second electrode; and a selector between the first electrode and the second electrode. The selector may be electrically connected to the first electrode and the second electrode. The selector may include the chalcogenide material.

In an embodiment, a memory device may include a first electrode; a second electrode; and a memory cell electrically connected between the first electrode and the second electrode at an intersection where the second electrode and the first electrode cross each other. The memory cell may include a memory element and a selector electrically connected to the memory element. The selector may include the chalcogenide material.

In some embodiments, the chalcogenide material may be a $Ge_wAs_xSe_yTe_z$-based material including the fourth component as a dopant, where w may be from 5 at % to 25 at %, x may be from 20 at % to 35 at %, 25 at %≤y+z≤60 at %, 0≤y, and z, provided that one of y and z is not 0. The fourth component may be configured to lower a leakage current of the memory cell compared to an other memory cell containing the $Ge_wAs_xSe_yTe_z$-based material without the fourth component.

In some embodiments, the chalcogenide material may be a $Ge_wAs_xSe_yTe_z$-based material including the fourth component as a dopant, where w may be from 5 at % to 25 at %, x may be from 20 at % to 35 at %, 25 at %≤y+z≤60 at %, 0≤y, and z, provided that one of y and z is not 0. The fourth component may be configured to increase a threshold voltage of the memory cell compared to an other memory cell containing the $Ge_wAs_xSe_yTe_z$-based material without the fourth component.

In some embodiments, the memory element may include a phase change material. The phase change material may be at least one of a transition metal oxide or a chalcogenide material.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
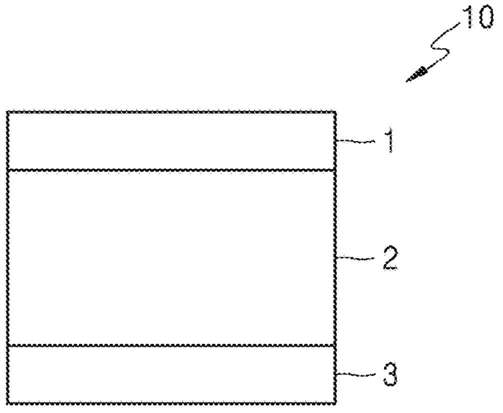
FIG. 1 is a schematic diagram of a device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, chalcogenide materials, and devices and memory devices each including the same according to example embodiments of the present disclosure will be described with reference to the accompanying drawings. Accordingly, it should be apparent to those skilled in the art that the following description of various embodiments of the present disclosure is provided for illustration purpose only and not for the purpose of limiting the present disclosure as defined by the appended claims and their equivalents.

Hereinafter, an element referred to as being "above" or "on" another element may be directly on the other element in contact therewith or intervening elements may also be present. An expression used in the singular encompasses the expression of the plural unless it has a clearly different meaning in the context. Throughout the specification, the terms "includes" and/or "including," if used herein, specify the presence of stated elements, but do not preclude the presence or addition of one or more other elements. As used herein, the term "combination" includes a mixture, an alloy, a reaction product, and the like unless otherwise stated. It will be understood that, although the terms first, second, third, fourth, etc. may be used herein to describe various components, these components should not be limited by these terms. These terms are only used to distinguish one component from another. The term "or" refers to "and/or" unless otherwise stated. Throughout the specification, when an element is referred to as being "connected to" another element, it may be directly or indirectly connected to the other element, or connected to the other element via a wireless communication network. As used herein, the terms "an embodiment", "embodiments", and the like indicate that elements described with regard to an embodiment are included in at least one embodiment described in this specification and may or may not present in other embodiments. In addition, it may be understood that the described elements are combined in any suitable manner in various embodiments. Unless otherwise defined, technical and scientific terms used herein have the same meaning as commonly understood by one or ordinary skill in the art to which this application belongs. All patents, patent applications, and other cited references are incorporated herein by reference in their entirety. However, in the event of any conflict or inconsistency between terms used herein and terms of the cited references, the terms used in this specification take precedence over the terms of the cited references. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modification, variations, improvements, and substantial equivalents.

As a material used to form an ovonic threshold switch (OTS) device, a chalcogenide material may be used. The chalcogenide material has a threshold voltage $V_{th}$ for switch-on to allow a current to flow through a switch. Recently, in memory devices requiring down-scaling, there may be a need to develop an ovonic threshold switch thin-film device having a thickness of 16 nm or less. However, the ovonic threshold switch thin-film device tends to have a lower threshold voltage $V_{th}$ and a higher leakage current as the thickness decreases.

Based on these properties, the present inventors have proposed a chalcogenide material having a novel composition as follows, and a device and a memory device each including the same.

A chalcogenide material according to an example embodiment includes: germanium (Ge) as a first component; arsenic (As) as a second component; at least one element selected from selenium (Se) and tellurium (Te) as a third component; and at least one element selected from the elements of Groups 2, 16, and 17 of the periodic table as a fourth component, wherein a content of the first component is from 5 at % to 30 at %, a content of the second component is from 20 at % to 40 at %, a content of the third component is from 25 at % to 75 at %, and a content of the fourth component is from 0.5 at % to 5 at %. The contents of the first component to the fourth component may be based on a total element amount in the chalcogenide material.

For example, the content of the first component may be from 5 at % to 25 at %. For example, the content of the second component may be from 20 at % to 35 at %. For example, the content of the third component may be from 25 at % to 60 at % chalcogenide material.

For example, the fourth component may include at least one element selected from beryllium (Be), sulfur (S), fluorine (F), chlorine (Cl), iodine (I), and bromine (Br), and the content of the fourth component may be from 0.5 at % to 5 at %.

The chalcogenide material has a configuration in which a GeAs(Se, Te)-based material is doped with the fourth component including at least one element selected from the elements of Groups 2, 16, and 17 of the periodic table, for example, beryllium (Be), sulfur (S), fluorine (F), chlorine (Cl), iodine (I), and bromine (Br). A selector including the GeAs(Se, Te)-based material doped with the fourth component has a higher threshold voltage $V_{th}$ and a lower leakage current than a selector including the GeAs(Se, Te)-based material.

The chalcogenide material may be a $Ge_wAs_xSe_yTe_z$-based material including the fourth component as a dopant, wherein w may be from 5 at % to 30 at % (e.g., from 5 at % to 25%, x may be from 20 at % to 40 at % (e.g., from 20 at % to 35 at %), 25 at %≤y+z≤75 at % (e.g., 25 at %≤y+z≤60 at %), 0≤y, and 0≤z, provided that one of y and z is not 0.

In example embodiments, the chalcogenide material may exhibit ovonic threshold switching properties.

A device according to an example embodiment includes a first electrode; a second electrode; and a selector electrically connected between the first electrode and the second electrode, wherein the selector includes the above-described chalcogenide material.

FIG. 1 is a schematic diagram of a device according to an example embodiment.

Referring to FIG. 1, a device 10 according to an example embodiment includes a first electrode 1; a second electrode 3; and a selector 2 electrically connected between the first electrode 1 and the second electrode 3. The selector 2 includes a chalcogenide material including: germanium (Ge) as a first component; arsenic (As) as a second component; at least one element selected from selenium (Se) and tellurium (Te) as a third component; and at least one element selected from the elements of Groups 2, 16, and 17 of the periodic table as a fourth component, wherein a content of the first component is from 5 at % to 30 at %, a content of the second component is from 20 at % to 40 at %, a content of the third component is from 25 at % to 75 at %, and a content of the fourth component is from 0.5 at % to 5 at %.

For example, the fourth component may include at least one element selected from beryllium (Be), sulfur (S), fluorine (F), chlorine (Cl), iodine (I), and bromine (Br).

The selector 2 may include a GeAs(Se,Te)-based material including the fourth component as a dopant.

The first electrode 1 and the second electrode 3 serve as a path of a current. The first electrode 1 and the second electrode 3 may be formed at both ends of the selector 2. Alternatively, the first electrode 1 and the second electrode 3 may optionally be formed of a conductive material. For example, the conductive material may be a metal, a conductive metal nitride, a metal oxide, or a combination thereof. For example, the conductive material may include at least one selected from carbon (C), a titanium nitride (TiN), a titanium silicon nitride (TiSiN), a titanium carbon nitride (TiCN), a titanium carbon silicon nitride (TiCSiN), a titanium aluminum nitride (TiAlN), tantalum (Ta), a tantalum nitride (TaN), tungsten (W), and a tungsten nitride (WN), without being limited thereto.

The selector 2 may be a selector layer. The selector layer may be formed by a deposition process (e.g., physicochemical deposition). For example, the selector layer may be formed to have a thickness of 16 nm or less by co-sputtering.

The selector 2 may be a current control layer capable of controlling a flow of current. The selector 2 may include a material layer whose resistance considerably varies in accordance with a magnitude of voltage applied to both ends of the selector 2. The selector 2 may include a material having ovonic threshold switching (OTS) properties. Functions of the selector 2 based on an OTS material will be briefly described. The selector 2 maintains a high resistance state allowing a current not to flow when a voltage lower than the threshold voltage $V_{th}$ is applied to the selector 2, and the selector 2 turns to a low resistance state allowing a current to flow when a voltage higher than the threshold voltage $V_{th}$ is applied to the selector 2. In addition, when a current flowing in the selector 2 decreases below a holding current, the selector 2 may turn into a high resistance state. The selector 2 may include a chalcogenide material as the OTS material.

The chalcogenide material according to an example embodiment may exhibit ovonic threshold switching (OTS) properties.

The content of the first component, germanium (Ge), may be from 5 at % to 30 at %. For example, the content of germanium (Ge) used as the first component may be from 5 at % to 25 at %. It is understood that germanium (Ge) used as the first component may improve thermal stability of the chalcogenide material and realize stable switching properties within the content range described above. When the content of germanium (Ge) used as the first component is less than 5 at %, excellent thermal stability sufficient for use in a memory device may not be obtained. When the content of germanium (Ge) used as the first component is greater than 30 at %, the leakage current may increase or the switch may not be turned off, thereby deteriorating stable switching properties.

The content of arsenic (As) used as the second component may be from 20 at % to 40 at %. For example, the content of arsenic (As) used as the second component may be from 20 at % to 35 at %. It is understood that arsenic (As) used as the second component may improve thermal stability of the chalcogenide material within the content range described above. For example, arsenic (As) may increase volatilization temperature and/or crystallization temperature of the chalcogenide material, and thus thermal stability of the selector 2 including the chalcogenide switching material may be improved. For example, the chalcogenide material may have relatively high volatilization temperature and crystallization temperature, and damage or deterioration of the chalcogenide material may be prevented in a process of manufacturing a memory device using the chalcogenide material.

The third component may include at least one element selected from selenium (Se) and tellurium (Te). The content of the third component may be from 25 at % to 75 at %. For example, the content of the third component may be from 25 at % to 60 at %.

When selenium (Se) is used as the third component, it is understood that selenium (Se) used as the third component may reduce a leakage current (or off current) of the chalcogenide material within the content range described above. When the content of selenium (Se) used as the third component is less than 25 at %, the off current of the chalcogenide material may decrease. When the content of selenium (Se) used as the third component is greater than 75 at %, stable switching properties may not be realized. To realize stable switching properties, the content of, for example, germanium (Ge) used as the first component may be reduced.

When tellurium (Te) is used as the third component, it is understood that tellurium (Te) used as the third component may improve durability of the chalcogenide material and realize stable switching properties within the content range described above. When the content of tellurium (Te) used as the third component is less than 25 at %, durability of the chalcogenide material may deteriorate. When the content of tellurium (Te) used as the third component is greater than 75 at %, the leakage current of the chalcogenide material may increase or the switch may not be turned off, thereby deteriorating stable switching properties.

The chalcogenide material according to an example embodiment does not include silicon (Si). In the case where the chalcogenide material includes silicon (Si), it is difficult to form a high-quality selector layer. For example, to form the selector layer, a target is formed by sintering the chalcogenide material, and then a chalcogenide material is formed on a substrate from the target by collision of argon gas using, for example, a physical vapor deposition (PVD) process. However, when the chalcogenide material includes silicon (Si), silicon particles aggregate to be separated or pores may easily occur in the target during a process of forming the target, and accordingly the aggregated silicon particles may be present in a separate form in the selector. Therefore, the selector layer may have a non-uniform composition distribution and/or a non-uniform thickness, thereby deteriorating the quality of the selector layer. However, the chalcogenide material according to an example embodiment does not include silicon (Si), and thus a high-quality target may be formed and a selector layer formed using the target may have high quality.

The chalcogenide material according to an example embodiment does not include antimony (Sb). When the chalcogenide material includes antimony (Sb), the crystalline temperature of the chalcogenide material may decrease. Therefore, thermal stability of the chalcogenide material may deteriorate causing damage or deterioration of the chalcogenide material during a process of manufacturing a memory element such as a cross point structure using the chalcogenide material. However, the chalcogenide material according to an example embodiment does not include antimony (Sb), and the chalcogenide material may have excellent thermal stability.

The fourth component may include at least one element selected from the elements of Groups 2, 16, and 17 of the periodic table may include, for example, at least one element selected from beryllium (Be), sulfur (S), fluorine (F), chlorine (Cl), iodine (I), and bromine (Br). The content of the fourth component may be from 0.5 at % to 5 at %. The chalcogenide material including the fourth component may have a greater energy band gap between a conductive band and a valence band than that of a ternary chalcogenide material including the first component, the second component, and the third component within the content range described above. The chalcogenide material according to an example embodiment may have a lower leakage than that of a ternary chalcogenide material not including the fourth component. In the chalcogenide material according to an example embodiment, the above-described contents of the first component, the second component, and the third component may be adjusted in accordance with the content of the added fourth component.

Figure 2:
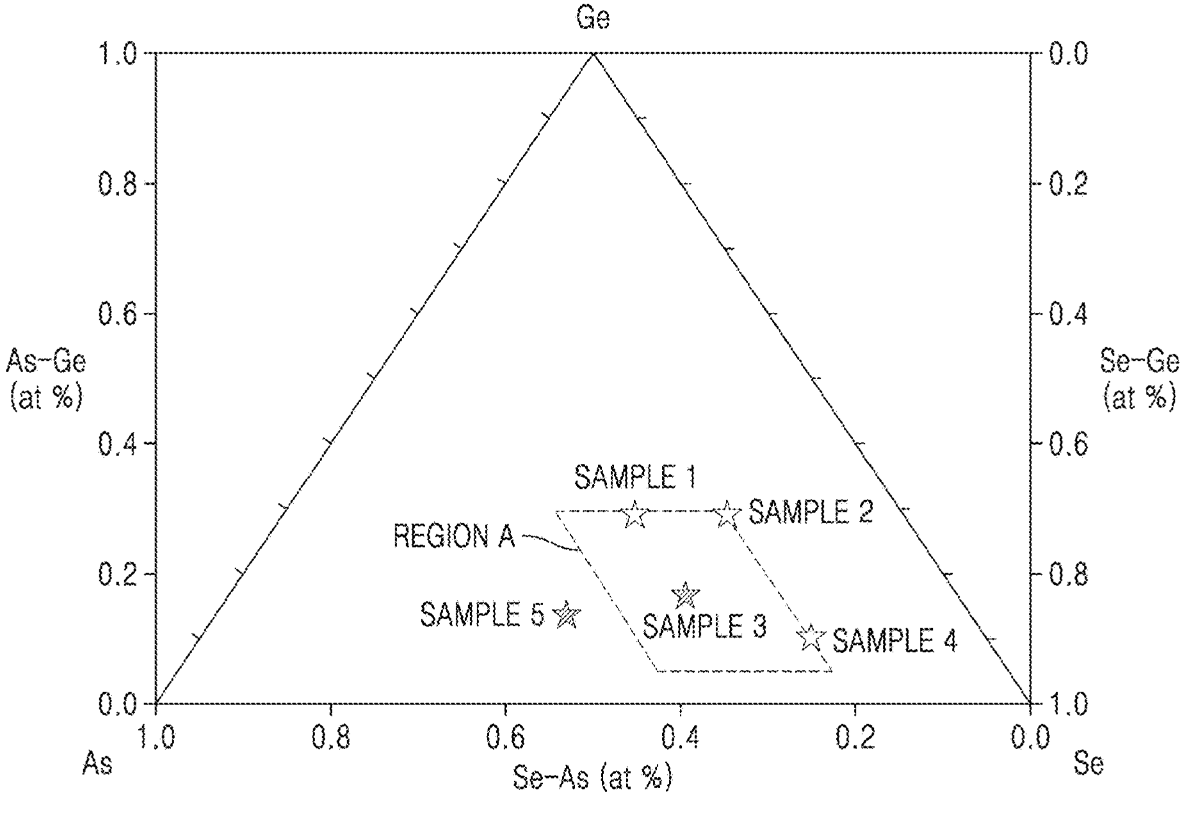
FIG. 2 is a ternary phase diagram illustrating composition regions of a first component (Ge), a second component (As), and a third component (Se, Te) of a chalcogenide material included in a selector in a device according to an example embodiment.

FIG. 2 is a ternary phase diagram illustrating composition regions of the first component (Ge), the second component (As), and the third component (Se, Te) of the chalcogenide material included in the selector 2 in the device according to an example embodiment.

Referring to FIG. 2, the ternary phase diagram shows REGION A including 5 at % to 30 at % of the first component (Ge), 20 at % to 40 at % of the second component (As), and 25 at % to 75 at % of the third component (Se, Te).

Figure 3:
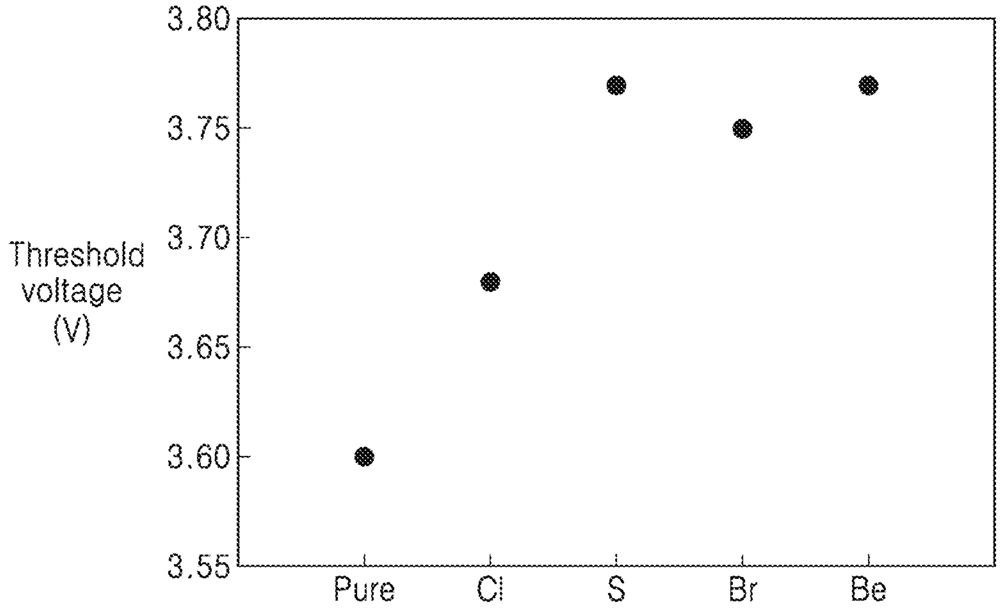
FIG. 3 is a graph illustrating threshold voltages $V_{th}$ of selectors including $Ge_{17}Se_{52}As_{31}$ SAMPLE 3 Pure and $Ge_{17}Se_{52}As_{31}$ (Be, S, F, Cl, I, or Br)$_5$ SAMPLE 3 doped with 5 at % of beryllium (Be), sulfur (S), fluorine (F), chlorine (Cl), iodine (I), or bromine (Br) as the fourth component in a REGION A of FIG. 2.

FIG. 3 is a graph illustrating threshold voltages $V_{th}$ of selectors including $Ge_{17}Se_{52}As_{31}$ SAMPLE 3 Pure and $Ge_{17}Se_{52}As_{31}$ (Be, S, F, Cl, I, or Br)$_5$ SAMPLE 3 doped with 5 at % of beryllium (Be), sulfur (S), fluorine (F), chlorine (Cl), iodine (I), or bromine (Br) as the fourth component in the REGION A of FIG. 2.

Figure 4:
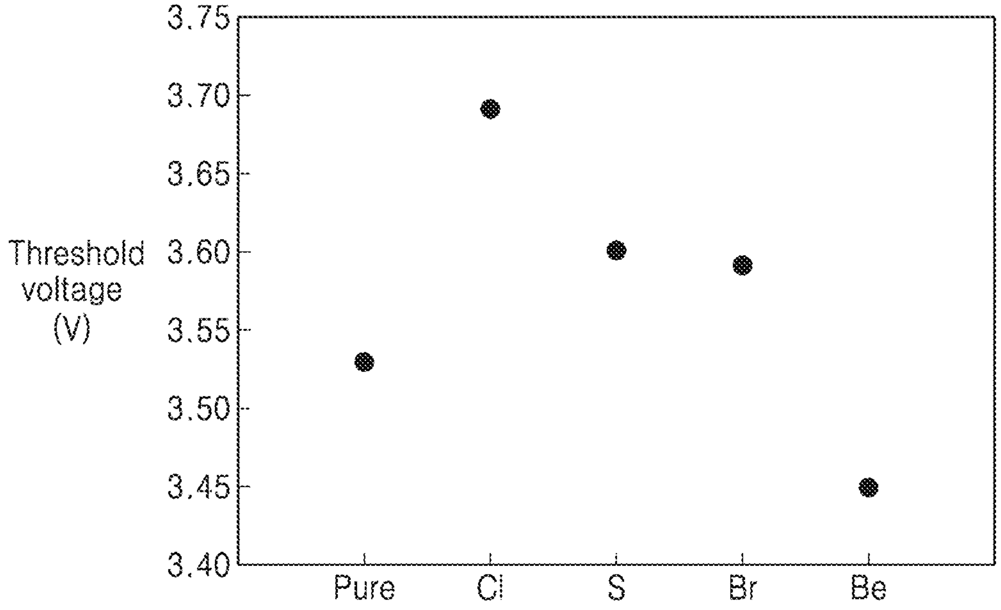
FIG. 4 is a graph illustrating threshold voltages $V_{th}$ of selectors including $Ge_{14}Se_{40}As_{46}$ SAMPLE 5 Pure, and $Ge_{14}Se_{40}As_{46}$ (Be, S, F, Cl, I, or Br)$_5$ SAMPLE 5 doped with 5 at % of beryllium (Be), sulfur (S), fluorine (F), chlorine (Cl), iodine (I), or bromine (Br) as a fourth component outside the REGION A of FIG. 2.

FIG. 4 is a graph illustrating threshold voltages $V_{th}$ of selectors including $Ge_{14}Se_{40}As_{46}$ SAMPLE 5 Pure, and $Ge_{14}Se_{40}As_{46}$ SAMPLE 5 doped with 5 at % of beryllium (Be), sulfur (S), fluorine (F), chlorine (Cl), iodine (I), or bromine (Br) as the fourth component outside the REGION A of FIG. 2.

Referring to FIG. 3, the threshold voltage $V_{th}$ of the selector including $Ge_{17}Se_{52}As_{31}$ (Be, S, F, Cl, I, or Br)$_5$ SAMPLE 3 doped is higher than the threshold voltage $V_{th}$ of the selector including $Ge_{17}Se_{52}As_{31}$ SAMPLE 3 Pure by about 0.08 eV to 0.17 eV in REGION A of FIG. 2. Referring to FIGS. 3 and 4, the threshold voltage $V_{th}$ of the selector including the SAMPLE 3 undoped or doped with the fourth component in the REGION A of FIG. 2 is higher than the threshold voltage $V_{th}$ of the selector including the chalcogenide material undoped or doped with the fourth component outside the REGION A of FIG. 2 by about 0.01 eV to 0.32 eV.

Figure 5:
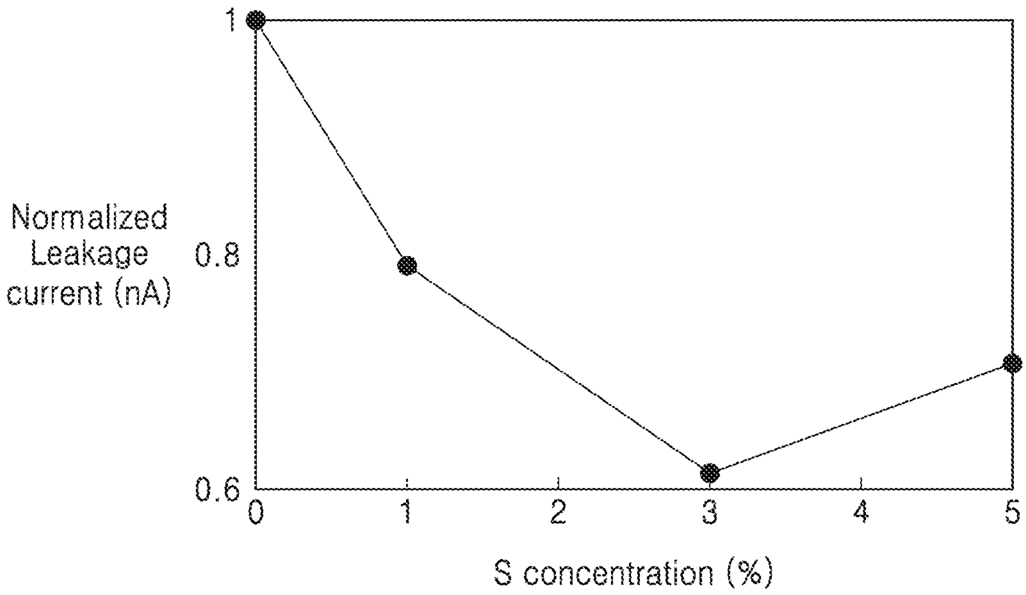
FIG. 5 illustrates the normalized leakage current of selection device according to the sulfur content in SAMPLE 3.

FIG. 5 illustrates the normalized leakage current of selection device according to the sulfur content in SAMPLE 3. In FIG. 5, the vertical axis represents a value of normalized leakage current and the horizontal axis represents sulfur content.

Referring to FIG. 5, the leakage current of a selection device including samples doped with sulfur content of 0 at %, 1 at %, and 3 at % in SAMPLE 3 is decreased. When the sulfur content is excessively large, for example, the sulfur content exceeds 5.0 at %, the leakage current is increased. The normalized leakage current decreases as the sulfur content increases from 0 at % to 3 at %, but increases as the sulfur content approaches 5 at %.

Figure 6:
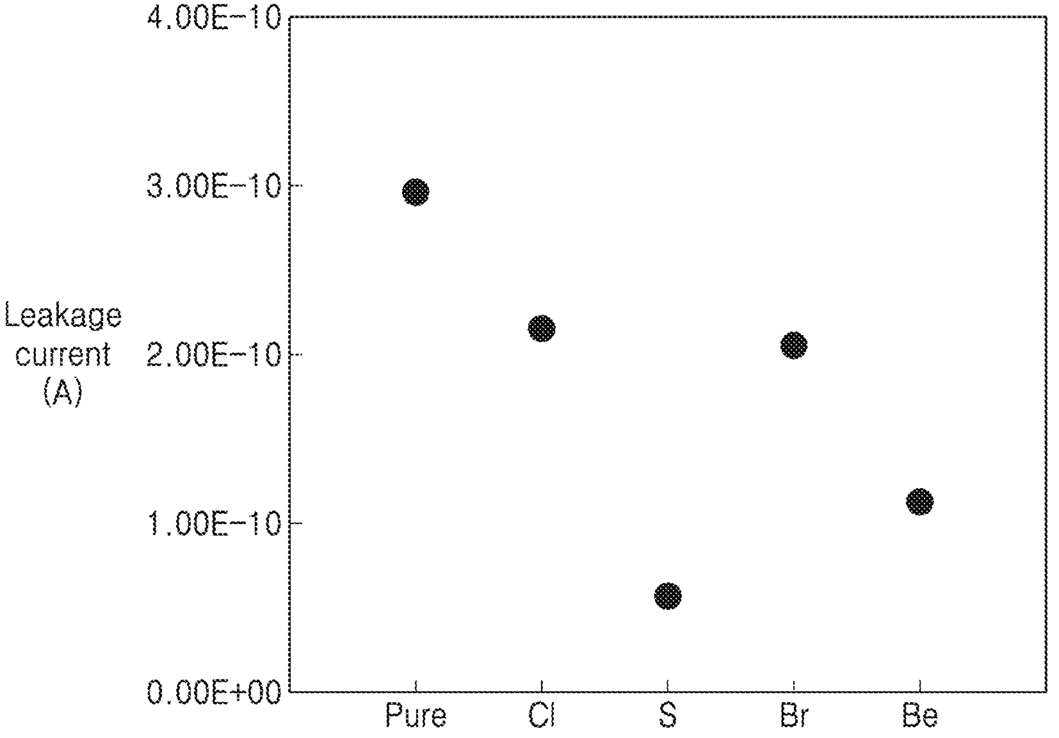
FIG. 6 is a graph illustrating leakage currents of selectors including $Ge_{17}Se_{52}As_{31}$ SAMPLE 3 Pure and $Ge_{17}Se_{52}As_{31}$ (Be, S, F, Cl, I, or Br)$_5$ SAMPLE 3 doped with 5 at % of beryllium (Be), sulfur (S), fluorine (F), chlorine (Cl), iodine (I), or bromine (Br) as a fourth component in the REGION A of FIG. 2.

FIG. 6 is a graph illustrating leakage currents of selectors including $Ge_{17}Se_{52}As_{31}$ SAMPLE 3 Pure and $Ge_{17}Se_{52}As_{31}$ (Be, S, F, Cl, I, or Br)$_5$ SAMPLE 3 doped with 5 at % of beryllium (Be), sulfur (S), fluorine (F), chlorine (Cl), iodine (I), or bromine (Br) as the fourth component in the REGION A of FIG. 2.

Figure 7:
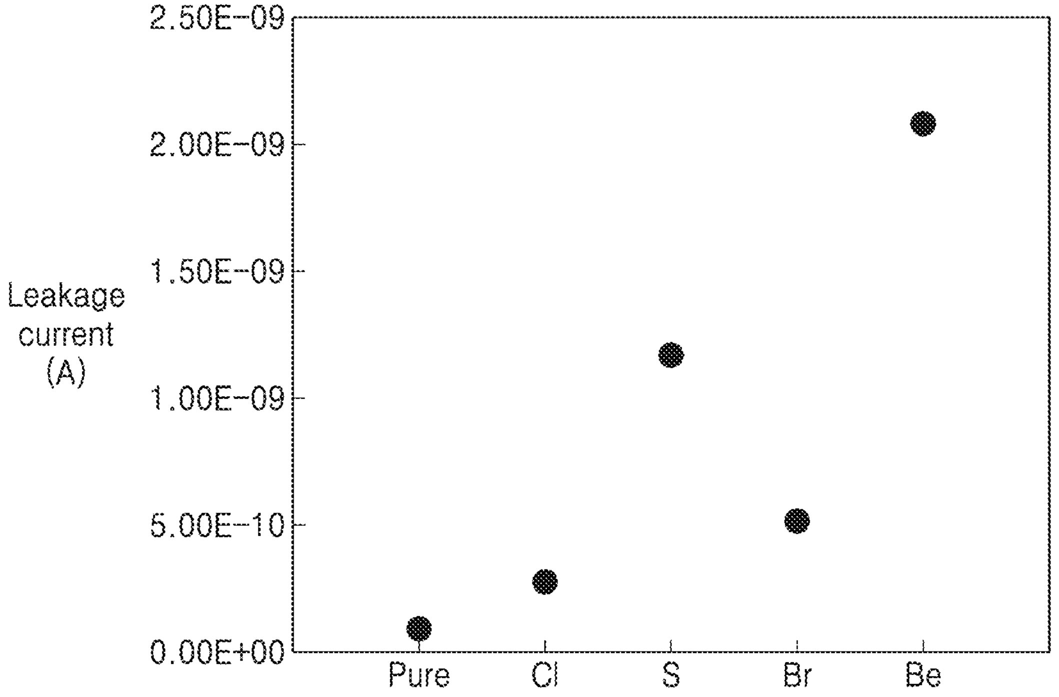
FIG. 7 is a graph illustrating leakage currents of selectors including $Ge_{14}Se_{40}As_{46}$ SAMPLE 5 Pure, and $Ge_{14}Se_{40}As_{46}$ (Be, S, F, Cl, I, or Br)$_5$ SAMPLE 5 doped with 5 at % of beryllium (Be), sulfur (S), fluorine (F), chlorine (Cl), iodine (I), or bromine (Br) as a fourth component outside the REGION A of FIG. 2.

FIG. 7 is a graph illustrating leakage currents of selectors including $Ge_{14}Se_{40}As_{46}$ SAMPLE 5 Pure, and $Ge_{14}Se_{40}As_{46}$ (Be, S, F, Cl, I, or Br)$_5$ SAMPLE 5 doped with 5 at % of beryllium (Be), sulfur (S), fluorine (F), chlorine (Cl), iodine (I), or bromine (Br) as the fourth component outside the REGION A of FIG. 2.

Referring to FIG. 6, the leakage current of the selector including $Ge_{17}Se_{52}As_{31}$ (Be, S, F, Cl, I, or Br)$_5$ SAMPLE 3 doped is lower than the leakage current of the selector including $Ge_{17}Se_{52}As_{31}$ SAMPLE 3 Pure by about 0.08 nA to 0.24 nA in the REGION A of FIG. 2. Referring to FIGS. 6 and 7, the leakage current of the selector including the SAMPLE 3 undoped or doped with the fourth component in the REGION A of FIG. 2 is lower than the leakage current of the selector including the chalcogenide material undoped or doped with the fourth component outside the REGION A of FIG. 2 by about 0.01 nA to 0.28 nA. Referring to FIGS. 3, 4, 6, and 7, it may be confirmed that the selector including $Ge_{17}Se_{52}As_{31}$ (Be, S, F, Cl, I, or Br)$_5$ SAMPLE 3 doped in the REGION A of FIG. 2 had a higher threshold voltage $V_{th}$ and a lower leakage current than those of the selector including $Ge_{17}Se_{52}As_{31}$ SAMPLE 3 Pure and the selector including the chalcogenide material undoped or doped with the fourth compound outside the REGION A of FIG. 2.

Figure 8:
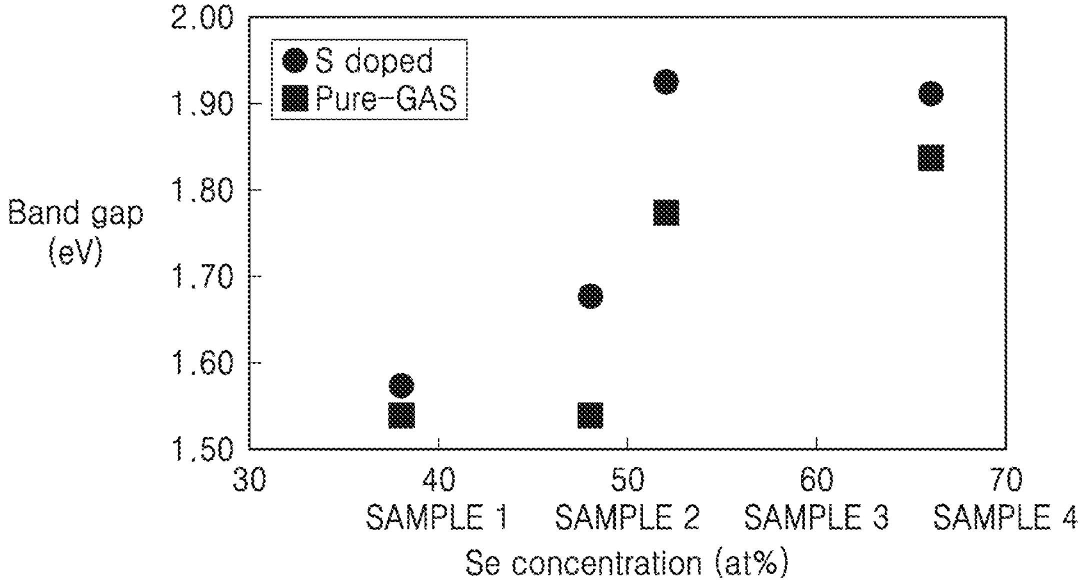
FIG. 8 is a graph illustrating energy band gaps of $Ge_{26}Se_{38}As_{29}$ SAMPLE 1, $Ge_{26}Se_{48}As_{19}$ SAMPLE 2, $Ge_{17}Se_{52}As_{31}$ SAMPLE 3, and $Ge_{10}Se_{66}As_{19}$ SAMPLE 4 which are undoped and doped with 5 at % of sulfur (S) in the REGION A of FIG. 2.

FIG. 8 is a graph illustrating energy band gaps of $Ge_{26}Se_{38}As_{29}$ SAMPLE 1, $Ge_{26}Se_{48}As_{19}$ SAMPLE 2, $Ge_{17}Se_{52}As_{31}$ SAMPLE 3, and $Ge_{10}Se_{66}As_{19}$ SAMPLE 4 which are undoped and doped with 5 at % of sulfur (S) in the REGION A of FIG. 2.

Figure 9:
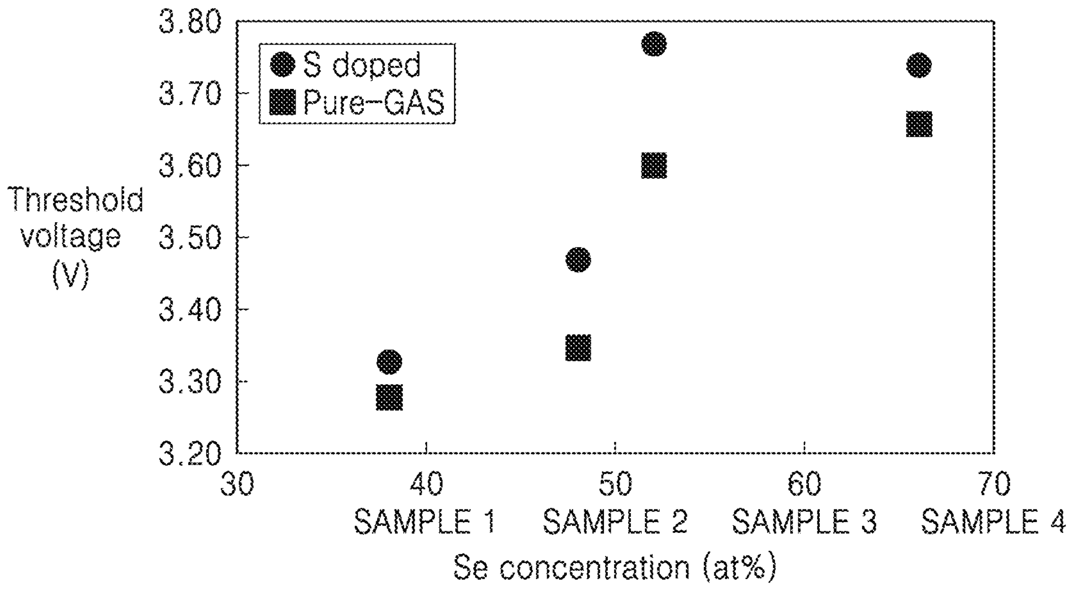
FIG. 9 is a graph illustrating threshold voltages $V_{th}$ of selectors including $Ge_{26}Se_{38}As_{29}$ SAMPLE 1, $Ge_{26}Se_{48}As_{19}$ SAMPLE 2, $Ge_{17}Se_{52}As_{31}$ SAMPLE 3, and $Ge_{10}Se_{66}As_{19}$ SAMPLE 4 which are undoped and doped with 5 at % of sulfur (S) in the REGION A of FIG. 2.

FIG. 9 is a graph illustrating threshold voltages $V_{th}$ of selectors including $Ge_{26}Se_{38}As_{29}$ SAMPLE 1, $Ge_{26}Se_{48}As_{19}$ SAMPLE 2, $Ge_{17}Se_{52}As_{31}$ SAMPLE 3, and $Ge_{10}Se_{66}As_{19}$ SAMPLE 4 which are undoped and doped with 5 at % of sulfur (S) in the REGION A of FIG. 2.

Figure 10:
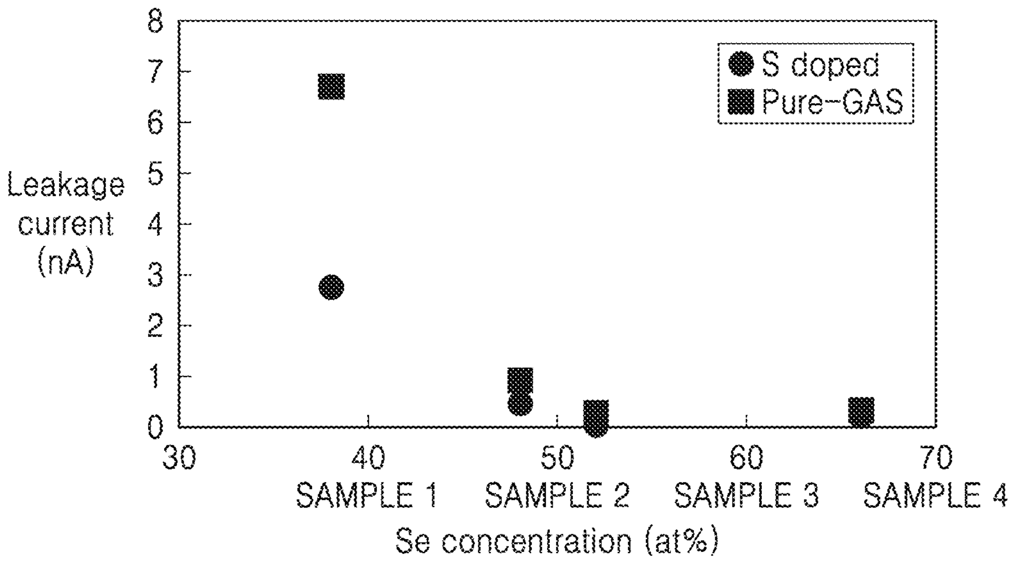
FIG. 10 is a graph illustrating leakage currents of selectors including $Ge_{26}Se_{38}As_{29}$ SAMPLE 1, $Ge_{26}Se_{48}As_{19}$ SAMPLE 2, $Ge_{17}Se_{52}As_{31}$ SAMPLE 3, and $Ge_{10}Se_{66}As_{19}$ SAMPLE 4 which are undoped and doped with 5 at % of sulfur (S) in the REGION A of FIG. 2.

FIG. 10 is a graph illustrating leakage currents of selectors including $Ge_{26}Se_{38}As_{29}$ SAMPLE 1, $Ge_{26}Se_{48}As_{19}$ SAMPLE 2, $Ge_{17}Se_{52}As_{31}$ SAMPLE 3, and $Ge_{10}Se_{66}As_{19}$ SAMPLE 4 which are undoped and doped with 5 at % of sulfur (S) in the REGION A of FIG. 2. In FIGS. 8 to 10, the SAMPLES 1, 2, and 4 are located at boundary areas of the REGION A of FIG. 2 and SAMPLE 3 is located in the REGION A.

Referring to FIG. 8, the energy band gaps of samples 1, 2, 3, and 4 (SAMPLE 1 to SAMPLE 4) doped with 5 at % of sulfur (S) are greater than those of the undoped samples 1, 2, 3, and 4 (SAMPLE 1 to SAMPLE 4) by about 0.035 eV to 0.160 eV. It may be confirmed that the energy band gaps of the samples doped with sulfur (S) are greater than the energy band gaps of the undoped samples at boundary areas of the REGION A and in the REGION A of FIG. 2.

Referring to FIG. 9, the threshold voltages $V_{th}$ of the selectors including the samples 1, 2, 3, and 4 (SAMPLE 1 to SAMPLE 4) doped with 5 at % of sulfur (S) are higher than the threshold voltages $V_{th}$ of the selectors including the undoped samples 1, 2, 3, and 4 (SAMPLE 1 to SAMPLE 4) by about 0.03 V to 0.12 V. It may be confirmed that the threshold voltages $V_{th}$ of the samples doped with sulfur (S) are higher than the threshold voltages $V_{th}$ of the undoped samples at boundary areas of the REGION A and in the REGION A of FIG. 2.

Referring to FIG. 10, the leakage currents of the selectors including the samples 1, 2, 3, and 4 (SAMPLE 1 to SAMPLE 4) doped with 5 at % of sulfur (S) are lower than the leakage currents of the selectors including the undoped samples 1, 2, 3, and 4 (SAMPLE 1 to SAMPLE 4) by about 0.15 nA to 3.94 nA. It may be confirmed that the leakage currents of the selectors including the samples dopes with sulfur (S) are lower than the leakage currents of the undoped samples at boundary areas of the REGION A and in the REGION A of FIG. 2.

A memory device according to an example embodiment includes: a bit line first electrode; a word line second electrode; and a memory cell electrically connected between the bit line first electrode and the word line second electrode at an intersection and including a memory element and a selector electrically connected to the memory element, the word line second electrode and the bit line first electrode crossing each other at the intersection, wherein the selector includes the above-described chalcogenide material. The selector and chalcogenide material are as described above and description thereof will be omitted.

Figure 11A:
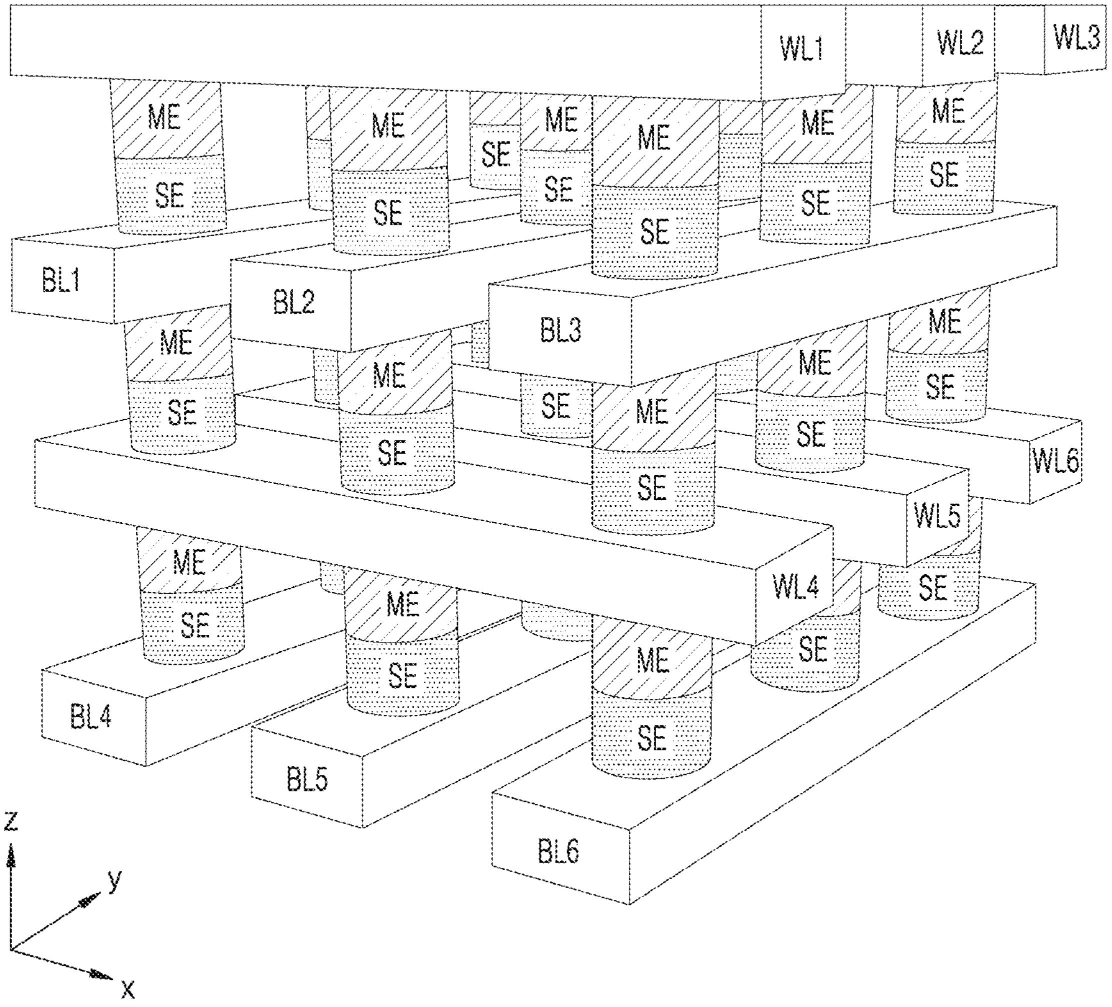
FIG. 11A is a perspective view illustrating a memory device according to an example embodiment.
Figure 11B:
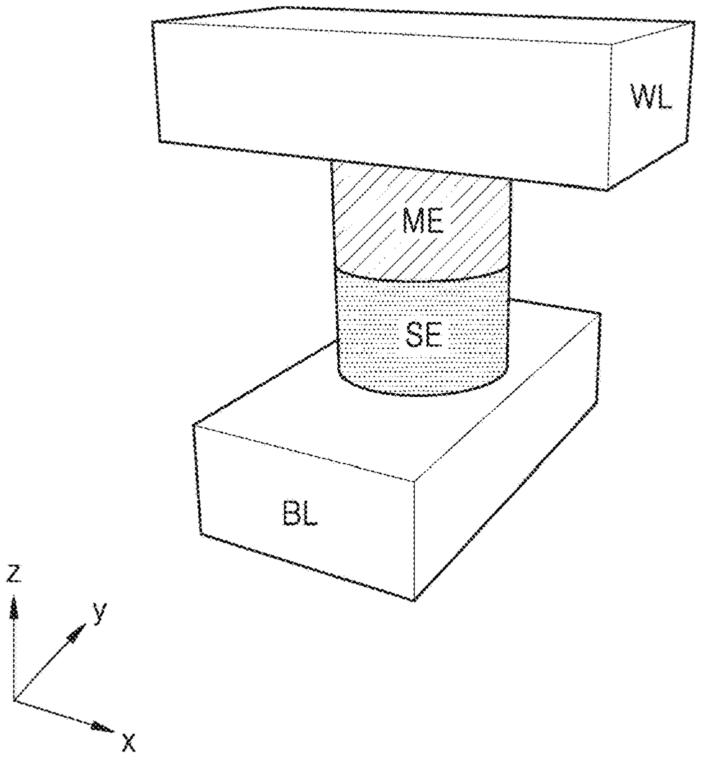
FIG. 11B is a perspective view illustrating a memory cell electrically connected at an intersection between a bit line first electrode and a word line second electrode of FIG. 11A.

FIG. 11A is a perspective view illustrating a memory device according to an example embodiment. FIG. 11B is a perspective view illustrating a memory cell electrically connected at an intersection of a word line second electrode and a bit line first electrode of FIG. 11A.

Referring to FIG. 11A, the memory device may include a plurality of word line second electrodes WL1, WL2, and WL3 extending in a first direction (e.g., X direction of FIG. 11A) and a plurality of bit line first electrodes BL1, BL2, and BL3 extending in a second direction (e.g., Y direction) perpendicular to the first direction. The plurality of word line second electrodes WL1, WL2, and WL3 and the plurality of bit line first electrodes BL1, BL2, and BL3 may cross each other at intersections. The memory device may include a plurality of memory cells at a plurality of intersections. The plurality of memory cells may be electrically connected to the plurality of word line second electrodes WL1, WL2, and WL3 and the plurality of bit line first electrodes BL1, BL2, and BL3, respectively. Each of the plurality of memory cells may include a memory element ME and a selector SE to select the memory cell. Meanwhile, unlike the view illustrated in FIG. 11A, the positions of the memory element ME and the selector SE may be reversed in each memory cell.

The memory cell may have a cylindrical pillar structure as shown in the drawing. However, the structure is not limited thereto and the memory cell may also have various pillar shapes such as an elliptical column and a polygonal column shape. Also, the memory cell may have a structure in which a lower portion is wider than an upper portion or a structure in which an upper portion is wider than a lower portion according to a method of forming the plurality of memory cells. For example, in the case where the plurality of memory cells are formed by an engraving etching process, the memory cell may have a structure in which a lower portion is wider than an upper portion. In addition, in the case where the plurality of memory cells are formed by a damascene process, the memory cell may have a structure in which an upper portion is wider than a lower portion. However, the width difference between the upper portion and the lower portion may be decreased to be almost zero by etching material layers such that the side is almost vertical by precisely control etching in the engraving etching process or damascene process.

Briefly descriptions of a method of driving the memory device, a current may flow in the memory element ME by applying a voltage to the memory element ME of the memory cell via the bit line first electrode BL1, BL2, or BL3 and the word line second electrode WL1, WL2, or WL3. For example, the memory element ME may include a phase change material layer enabling a reversible phase transition between a first state and a second state. However, the memory element ME is not limited thereto, and any memory element may be used as long as resistance of the memory element ME varies according to a voltage applied thereto. In accordance with the resistance change of the memory element ME, the memory cell may store or erase digital information of '0' or '1'. For example, the memory cell may store data by writing '0' for a high resistance state and '1' for a low resistance state. However, digital information for the memory element ME is not limited to '0' for the high resistance state and '1' for the low resistance state and various resistance states may also be stored. If necessary, the memory element ME may have a multilayer structure in which two or more layers having different physical properties are stacked or a super-lattice structure in which a plurality of layers including different materials are alternately stacked.

Each of the bit line first electrodes BL1, BL2, and BL3 and the word line second electrodes WL1, WL2, and WL3 may include a metal, a conductive metal nitride, a conductive metal oxide, or a combination thereof. For example, each of the bit line first electrodes BL1, BL2, and BL3 and the word line second electrodes WL1, WL2, and WL3 may include W, WN, Au, Ag, Cu, Al, TiAlN, Ir, Pt, Pd, Ru, Zr, Rh, Ni, Co, Cr, Sn, Zn, ITO, an alloy thereof, or a combination thereof. In addition, each of the bit line first electrodes BL1, BL2, and BL3 and the word line second electrodes WL1, WL2, and WL3 may include a metal film and a conductive barrier layer to cover at least one portion of the metal film. The conductive barrier layer may include, for example, Ti, TiN, Ta, TaN, or a combination thereof.

Figure 11C:
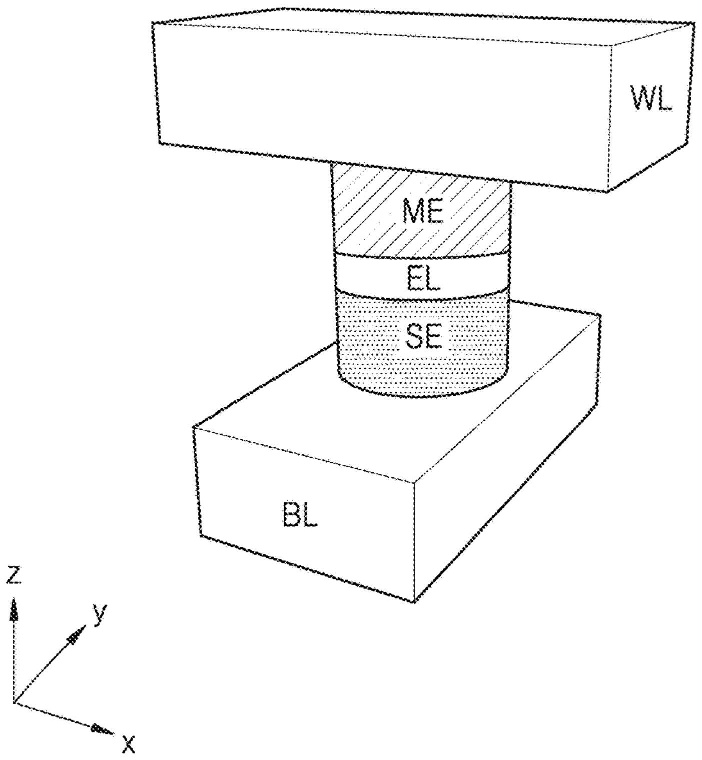
FIG. 11C is a perspective view illustrating a memory cell in which a third electrode is interposed between a memory element and a selector in the memory cell of FIG. 11B.

FIG. 11C is a perspective view illustrating a memory cell in which a third electrode is interposed between the memory element and the selector in the memory cell of FIG. 11B.

Referring to FIG. 11C, a third electrode EL is further disposed between the memory element ME and the selector SE in the memory cell of FIG. 11B. The third electrode EL is interposed between the memory element ME and the selector SE in contact therewith. The third electrode EL may serve as a heating electrode layer. The third electrode EL may serve to heat the memory element ME in an operation of writing '0' for the high resistance state and '1' for the low resistance state or, on the contrary, in an operation of writing '1' for the low resistance state and '0' for the high resistance state. The third electrode EL may include a conductive material capable of generating heat sufficient for phase transition of the memory element ME without reacting with the memory element ME. For example, the third electrode EL may include a carbonaceous conductive material. For example, the third electrode EL may include a metal having a high melting point or a nitride thereof, such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), a silicon carbide (SiC), a silicon carbon nitride (SiCN), a carbon nitride (CN), a titanium carbon nitride (TiCN), a tantalum carbon nitride (TaCN), or a combination thereof, without being limited thereto.

The memory cell according to an example embodiment may include a non-volatile memory element.

The memory device according to an example embodiment may include a phase-change random access memory (PRAM), a resistive RAM (RRAM), or a magnetic RAM (MRAM).

When the memory element included in the memory device includes a phase change material that reversely changes between an amorphous state and a crystalline state according to heating time, the memory device may be a phase-change random access memory (PRAM). The phase of the PRAM memory device may be reversibly changed by Joule's heat generated by a voltage applied to both ends of the memory element. For example, the phase change material may turn to a high resistance state in an amorphous phase and turn to a low resistance state in a crystalline phase. By defining the high resistance state as '0', and the low resistance state as '1', data may be stored in the memory element. As an example of the phase change material, a chalcogenide material may be used. For example, the phase change material may include a GeSbTe (GST-based) material. For example, the GeSbTe(GST)-based may be $Ge_2Sb_2Te_5$, $Ge_2Sb_2Te_7$, $GeSb_2Te_4$, or $GeSb_4Te_7$. However, the embodiment is not limited thereto, and the phase change material may include a chalcogenide material including two or more elements selected from silicon (Si), germanium (Ge), antimony (Sb), tellurium (Te), bismuth (Bi), indium (In), tin (Sn), and selenium (Se). The elements constituting the chalcogenide material may have various stoichiometric ratios.

When the material used to form the memory element included in the memory device includes a transition metal oxide, the memory device may be a resistive RAM (RRAM). In a memory element including the transition metal oxide, at least one electrical path may be created or broken by a program operation. When the electrical path is created, the memory element may have a low resistance value and when the electrical path is broken, the memory element may have a high resistance value. The memory device may store data by using a resistance difference of the memory element. The transition metal oxide may include at least one metal selected from Ta, Zr, Ti, Hf, Mn, Y, Ni, Co, Zn, Nb, Cu, Fe, and Cr. For example, the transition metal oxide may form a single layer or a multilayer including at least one selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above-described materials, x and y may be selected from the ranges $0 \leq x \leq 1.5$ and $0 \leq y \leq 0.5$, respectively, but are not limited thereto.

When the memory element has a magnetic tunnel junction (MTJ) structure including two electrodes each formed of a magnetic material and a dielectric material interposed between the two magnetic electrodes, the memory device may be a magnetic RAM (MRAM). The two electrodes may be a magnetic pinned layer and a magnetic free layer, respectively, and the dielectric material interposed therebetween may be a tunnel barrier layer. The magnetic pinned layer has an orientation of magnetization fixed in one direction, and the magnetic free layer may have a variable orientation of magnetization to be parallel or antiparallel to the orientation of magnetization of the magnetic pinned layer. The orientations of magnetization of the magnetic pinned layer and the magnetic free layer may be parallel to one surface of the tunnel barrier layer, without being limited thereto.

The orientations of magnetization of the magnetic pinned layer and the magnetic free layer may be perpendicular to one surface of the tunnel barrier layer. When the orientation of magnetization of the magnetic free layer is parallel to the orientation of magnetization of the magnetic pinned layer, the memory element may have a first resistance value. Meanwhile, when the orientation of magnetization of the magnetic free layer is anti-parallel to the orientation of magnetization of the magnetic pinned layer, the memory element may have a second resistance value. The memory device may store data by using such difference between resistance values. The orientation of magnetization of the magnetic free layer may be changed by spin torque of electrons in a program current. The magnetic pinned layer and the magnetic free layer may include a magnetic material. In this case, the magnetic pinned layer may further include an anti-ferromagnetic substance to fix the orientation of magnetization of a ferromagnetic substance in the magnetic pinned layer. The tunnel barrier layer may include an oxide of at least one selected from Mg, Ti, Al, MgZn, and MgB, without being limited thereto.

A chalcogenide material according to an embodiment includes 5 at % to 30 at % of germanium (Ge) as a first component, 20 at % to 40 at % of arsenic (As) as a second component, 25 at % to 75 at % of at least one element selected from selenium (Se) and tellurium (Te) as a third component, and 0.5 at % to 5 at % of at least one element selected from the elements of Groups 2, 16, and 17 of the periodic table as a fourth component. The chalcogenide material exhibits ovonic threshold switching properties. When the chalcogenide material is included in a selector, a higher threshold voltage $V_{th}$ and a lower leakage current may be obtained when compared with a selector including GeAs(Se, Te).

Figure 12A:
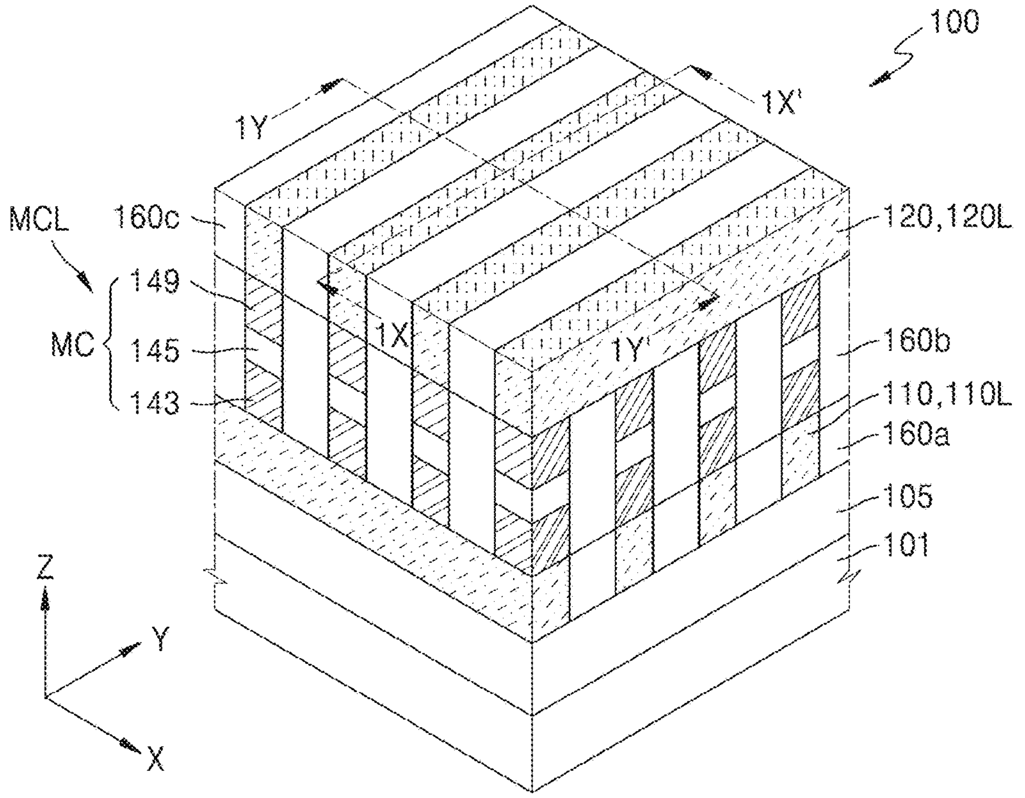
FIG. 12A is a perspective view of a semiconductor device.
Figure 12B:
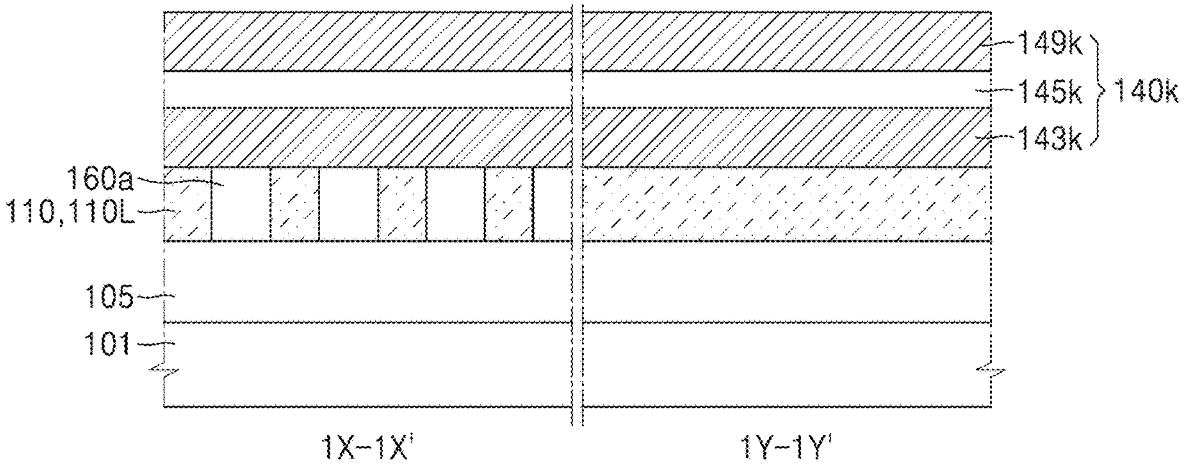
FIGS. 12B to 12D are schematic diagrams illustrating a method of manufacturing a semiconductor device according to example embodiments.
Figure 12C:
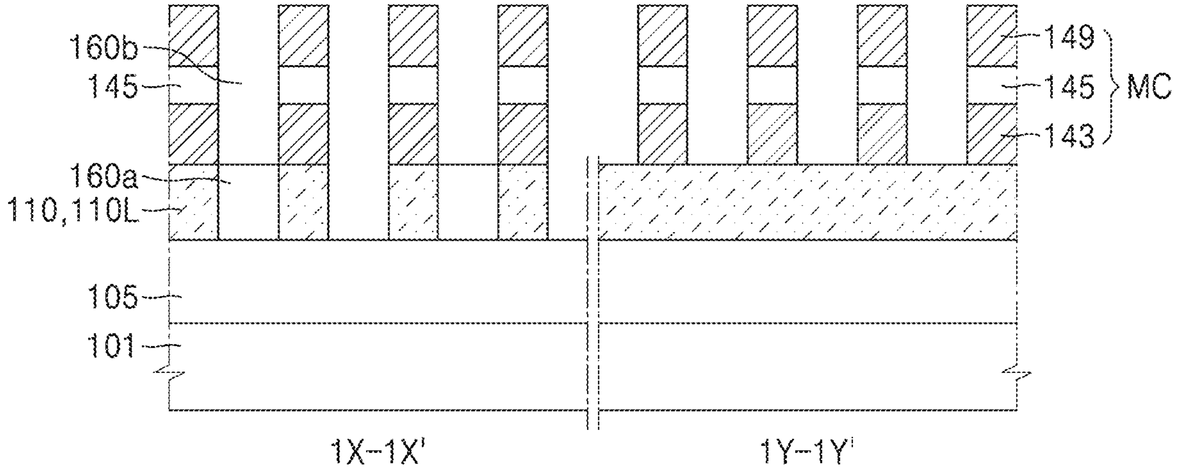
Figure 12D:
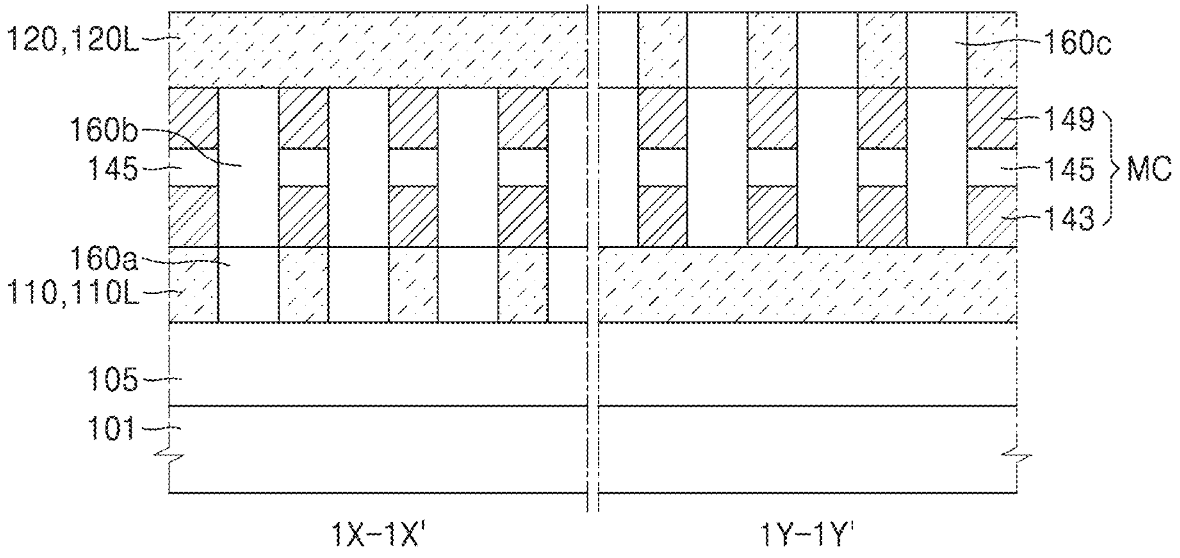

FIG. 12A is a perspective view of a semiconductor device and FIGS. 12B to 12D are schematic diagrams illustrating a method of manufacturing a semiconductor device according to example embodiments.

Referring to FIG. 12A, a semiconductor device includes a substrate 101 (e.g., Si, Ge, SiGe, SiC, GaAs, and the like), an insulating layer 105 (e.g., silicon oxide or silicon nitride), first electrode lines 110 (110L), memory cells MC, second electrode lines 120 (120L), and insulating material 160*a* to 160*c*. The semiconductor device may be a memory device and may be made according to operations in FIGS. 12B to 12D. The memory cells MC may include a selection device material layer 143 including a chalcogenide material according to example embodiments.

Referring to FIG. 12B, an insulating layer 105 is formed on a substrate 101. A first electrode line layer 110L including a plurality of first electrode lines 110, which extend in a first direction (X direction) and are apart from each other, is formed on the insulating layer 105. The first electrode line layer 110L may be formed by forming a conductive layer for first electrode lines 110 and then patterning the conductive layer by etching. A first insulating layer 160*a*, such as silicon oxide, may be filled between the first electrode lines 110. The first insulating layer 160*a* may be formed by filling gaps between the first electrode lines 110 with an insulating material and leveling the insulating material through a chemical mechanical polishing (CMP) process until the top surfaces of the first electrode lines 110 are exposed. A selection device material layer 143*k*, an electrode material layer 145*k*, and a variable resistance material layer 149*k* are sequentially stacked on the first electrode line layer 110L and the first insulating layer 160*a* to form a stack structure 140*k*.

Referring to FIG. 12C, mask patterns (not shown) spaced apart from each other in the first direction (X direction) and a second direction (Y direction) are formed on the stack structure 140*k*, and the stack structure 140*k* is etched using the mask patterns until portions of the top surfaces of the first insulating layer 160*a* and the first electrode lines 110 are exposed. A plurality of semiconductor devices MC spaced apart from each other in the first direction and the second direction may be formed according to the structure of the mask patterns. The plurality of semiconductor devices MC may each include a selection device layer 143, an electrode layer 145, and a variable resistance layer 149 and may be electrically connected to the first electrode lines 110. In addition, the mask patterns may be removed through an ashing and stripping process.

Referring to FIG. 12D, a second insulating layer 160*b* may be filled between the semiconductor devices MC. A second electrode line layer 120L including a plurality of second electrode lines 120, which extend in the second direction (X direction) and are apart from each other, is formed on the semiconductor devices MC and the second insulating layer 160*b*. A third insulating layer 160*c* may be filled between the second electrode lines 120.

Components such as the first and second electrode lines 110 and 120, the electrode layer 145, the insulating layers 105, 160*a*, 160*b*, 160*c*, the selection device layer 143, and the variable resistance layer 149 each may be independently formed to have a desired composition and thickness through a deposition method such as atomic layer deposition (ALD), chemical vapor deposition (CVD), physical vapor deposition (PVD), or sputtering. For example, the selection device material layer 143*k* may be formed by a PVD or sputtering method using a source or target including a chalcogenide material according to example embodiments.

Figure 13:
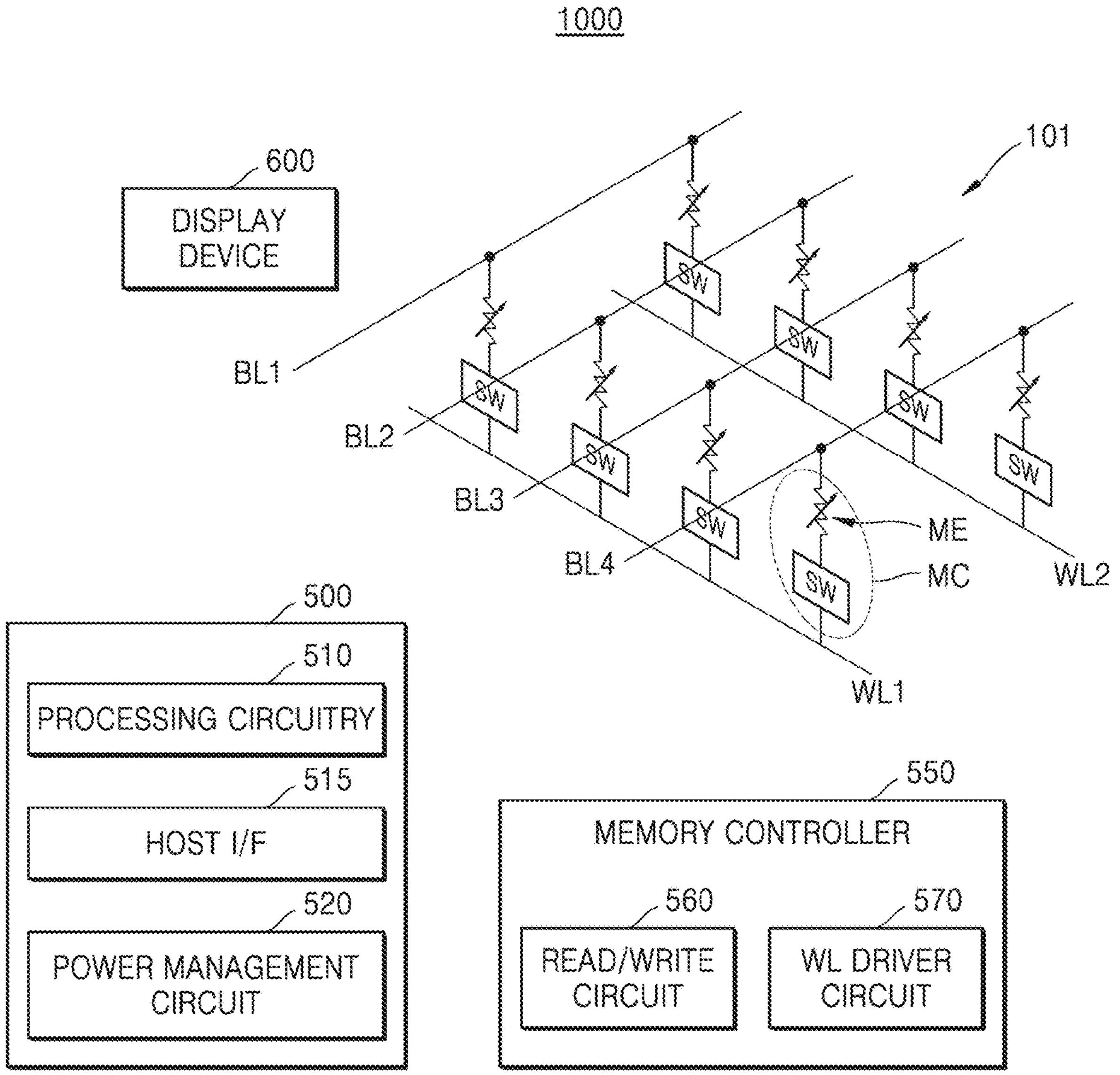
FIG. 13 is a diagram of an electronic device including a semiconductor device according to example embodiments.

FIG. 13 is a diagram of an electronic device including a semiconductor device according to example embodiments.

Referring to FIG. 13, an electronic device 1000 may include a controller 500, memory controller 550, display device 600 (e.g., OLED display, holographic display), and semiconductor apparatus 100. The memory controller 550 may include a read/write circuit 560 and a word line driver circuit 570. The read/write circuit 560 and word line driver circuit 570 may be electrically connected to the semiconductor apparatus 100 through first electrode lines (e.g., WL1) and second electrode lines (e.g., BL1). The controller 500 may control operations of the electronic device 1000 and may include processing circuitry 510, a host interface 515, and a power management circuit 520. The semiconductor apparatus 100 may be implemented using any one of the memory device in FIG. 11A, memory cells of FIGS. 11B and 11C, or semiconductor device described in FIG. 12A.

When the controller 500 receives commands from an external host (not shown) through the host interface 515, the processing circuitry 510 may operate in response to those commands and may control operations of the display device 600, memory controller 550, and/or semiconductor apparatus 100. The controller 500 may control the display device 600 by providing commands and information to the display device 600 and by controlling power to the display device 600 using the power management circuit 520. The controller 500 may control power provided to the memory controller 550 and semiconductor apparatus 100 using the power management circuit 520.

The controller 500 may control operations of the semiconductor apparatus 100 by providing commands to the memory controller 550. The controller 500 may also provide the memory controller 550 with data to be written in the semiconductor apparatus 100 and/or may receive data read from the semiconductor apparatus 100. The memory controller 550, in response to receiving commands from the controller 500 and/or in response to receiving data for a write operation, may control the semiconductor apparatus 100 using the read/write circuit 560 and word line driver circuit 570 to write data, read data, and/or erase data in one or more selected semiconductor unit devices MC of the semiconductor apparatus 100. The memory controller 550, in response to receiving commands from the controller 500, may read data from the semiconductor apparatus 100 and provide the data read from the semiconductor apparatus 100 to the controller 500.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A chalcogenide material comprising:

germanium (Ge) as a first component;

arsenic (As) as a second component;

at least one element selected from selenium (Se) and tellurium (Te) as a third component, and a fourth component, wherein a content of the first component is from 5 at % to 30 at %, a content of the second component is from 20 at % to 40 at %, a content of the third component is from 25 at % to 60 at % and a content of the fourth component is from 0.5 at % to 5 at %, wherein the chalcogenide material does not include silicon (Si), and the fourth component comprises the fourth component comprises beryllium (Be) and further comprises sulfur(S).

2. The chalcogenide material of claim 1, wherein the content of the first component is from 5 at % to 25 at %.

3. The chalcogenide material of claim 1, wherein the content of the second component is from 20 at % to 35 at %.

4. A device comprising:

a first electrode;

a second electrode; and a selector between the first electrode and the second electrode, the selector electrically connected to the first electrode and the second electrode, the selector comprising a chalcogenide material including germanium (Ge) as a first component, arsenic (As) as a second component, at least one element selected from selenium (Se) and tellurium (Te) as a third component, and a fourth component, wherein a content of the first component is from 5 at % to 30 at %, a content of the second component is from 20 at % to 40 at %, a content of the third component is from 25 at % to 75 at %, and a content of the fourth component is from 0.5 at % to 5 at % wherein the chalcogenide material does not include silicon (Si), and the fourth component comprises at least one element selected from beryllium (Be), or fluorine (F), chlorine (CI), iodine (I), and bromine (Br). the fourth component comprises beryllium (Be) and further comprises sulfur (S).

5. The device of claim 4, wherein the content of the first component is from 5 at % to 25 at %.

6. The device of claim 4, wherein the content of the second component is from 20 at % to 35 at %.

7. The device of claim 4, wherein the content of the third component is from 25 at % to 60 at %.

8. The device of claim 4, wherein the chalcogenide material exhibits ovonic threshold switching properties.

9. The device of claim 4, wherein an energy band gap of the chalcogenide material is greater than an energy band gap of an other chalcogenide material, and the other chalcogenide material comprises the first component, the second component, and the third component without the fourth component.

10. The device of claim 4, wherein a threshold voltage Vth of the selector is higher than a threshold voltage $V_{th}$ of an other selector, and the other selector comprises an other chalcogenide material, and the other chalcogenide material comprises the first component, the second component, and the third component without the fourth component.

11. The device of claim 4, wherein a leakage current of the selector is lower than a leakage current of an other selector, the other selector comprises an other chalcogenide material, and the other chalcogenide material comprises the first component, the second component, and the third component without the fourth component.

12. A memory device comprising:

a bit line first electrode;

a word line second electrode; and a memory cell electrically connected between the bit line first electrode and the word line second electrode at an intersection where the word line second electrode and the bit line first electrode cross each other, the memory cell comprising a memory element and a selector electrically connected to the memory element, wherein the selector comprises a chalcogenide material including germanium (Ge) as a first component, arsenic (As) as a second component, at least one element selected from selenium (Se) and tellurium (Te) as a third component, and a fourth component, wherein a content of the first component is from 5 at % to 30 at %, a content of the second component is from 20 at % to 40 at %, a content of the third component is from 25 at % to 75 at %, and a content of the fourth component is from 0.5 at % to 5 at % wherein the chalcogenide material does not include silicon (Si), and the fourth component comprises beryllium (Be), or the fourth component comprises beryllium (Be) and further comprises sulfur(S).

13. The memory device of claim 12, wherein the content of the first component is from 5 at % to 25 at %.

14. The memory device of claim 12, wherein the content of the second component is from 20 at % to 35 at %.

15. The memory device of claim 12, wherein the content of the third component is from 25 at % to 60 at %.

16. The memory device of claim 12, wherein the chalcogenide material exhibits ovonic threshold switching properties.

17. The memory device of claim 12, wherein an energy band gap of the chalcogenide material is greater than an energy band gap than of an other chalcogenide material, and the other chalcogenide material comprises the first component, the second component, and the third component without the fourth component.

18. The memory device of claim 12, wherein a threshold voltage $V_{th}$ of the selector is higher than a threshold voltage $V_{th}$ of an other selector, the other selector comprises an other chalcogenide material, and the other selector comprises the first component, the second component, and the third component without the fourth component.

19. The memory device of claim 12, wherein a leakage current of the selector is lower than a leakage current of an other selector, and the other selector includes a chalcogenide material comprising the first component, the second component, and the third component without the fourth component.

20. The memory device of claim 12, further comprising:

a third electrode between the memory element and the selector.

21. The memory device of claim 12, wherein the memory cell comprises a non-volatile memory element.

22. The memory device of claim 21, wherein the memory device comprises a phase-change random access memory (PRAM), a resistive RAM (RRAM), or a magnetic RAM (MRAM).

23. A chalcogenide material comprising:

a $Ge_wAs_xSe_yTe_z$-based material including a dopant, wherein germanium (Ge) as a first component;

arsenic (As) as a second component;

a third component including at least one of selenium (Se) and tellurium (Te), and the dopant includes beryllium (Be) or the dopant includes beryllium (Be) and further includes sulfur(S) , the chalcogenide material does not include silicon (Si), w is from 5 to 25, x is from 20 to 35, $25 \leq y+z \leq 60$, $0 \leq y$, and $0<z$.

24. The chalcogenide material of claim 1, wherein the third component includes selenium (Se).

25. The chalcogenide material of claim 1, wherein the third component includes tellurium (Te).

26. The chalcogenide material of claim 23, wherein $0<y$.

27. The chalcogenide material of claim 23, wherein the chalcogenide material exhibits ovonic threshold switching properties.

28. The chalcogenide material of claim 23, wherein the chalcogenide material does not include antimony (Sb).

29. A device comprising:

a first electrode;

a second electrode; and a selector between the first electrode and the second electrode, the selector electrically connected to the first electrode and the second electrode, the selector comprising the chalcogenide material of claim 23.

30. A memory device comprising:

a first electrode;

a second electrode; and a memory cell electrically connected between the first electrode and the second electrode at an intersection where the second electrode and the first electrode cross each other, the memory cell comprising a memory element and a selector electrically connected to the memory element, wherein the selector comprises the chalcogenide material of claim 23.

31. The memory device of claim 30, wherein the dopant is configured to lower a leakage current of the memory cell compared to an other memory cell containing the $Ge_wAs_w,Se_yTe_z$-based material without the dopant.

32. The memory device of claim 30, wherein the dopant is configured to increase a threshold voltage of the memory cell compared to an other memory cell containing the $Ge_wAs_xSe_yTe_z$-based material without the dopant.

33. The memory device of claim 30, wherein the memory element includes a phase change material.

34. The memory device of claim 33, wherein the phase change material is at least one of a transition metal oxide or a chalcogenide material.

* * * * *